United States Patent [19]
Sakamoto

[11] 3,760,193
[45] Sept. 18, 1973

[54] VOLTAGE MEMORY APPARATUS

[75] Inventor: Yoichi Sakamoto, Toyonaka City, Japan

[73] Assignee: Matsushita Electric Industrial Co., Ltd., Kadoma City, Osaka Prefecture, Japan

[22] Filed: Feb. 22, 1972

[21] Appl. No.: 227,753

[30] Foreign Application Priority Data

Feb. 19, 1971 Japan ............................46/8275
Feb. 19, 1971 Japan ............................46/8276
Feb. 19, 1971 Japan ............................46/8277
Feb. 19, 1971 Japan ............................46/8278
Feb. 19, 1971 Japan ............................46/8279

[52] U.S. Cl. ................ 307/233, 328/141, 328/151, 325/422, 325/470, 334/15
[51] Int. Cl. ......................... H04b 1/34, H03j 3/18
[58] Field of Search .................. 307/233, 246, 271; 325/335, 422, 433, 464, 469, 470; 328/134, 138, 141, 151; 334/15

[56] References Cited

UNITED STATES PATENTS 3,575,661 4/1971 Slavik .............................. 334/15 X
3,584,141 6/1971 Fujiwara et al. ................. 334/15 X
3,611,152 10/1971 Sakai et al. ...................... 325/422 X
3,631,349 12/1971 Rhee .................................. 325/470
3,644,853 2/1972 Ma ....................................... 334/15
3,657,654 4/1972 Friberg ............................. 334/15 X
3,697,885 10/1972 Avins et al. ...................... 325/422 X
3,699,455 10/1972 Kruszewski et al. .............. 334/15 X

FOREIGN PATENTS OR APPLICATIONS 1,240,144 7/1971 Great Britain ...................... 325/470

*Primary Examiner*—John W. Huckert
*Assistant Examiner*—L. N. Anagnos
*Attorney*—Paul M. Craig, Jr. et al.

[57] ABSTRACT

A voltage-memory apparatus comprises a main voltage-sweep circuit capable of holding a voltage without prominent loss of voltage and an auxiliary voltage-sweep circuit capable of boosting the held voltage. The memory apparatus is capable of memorizing a specified voltage applied to a variable capacitance diode which is provided as a tuning capacitance in tuner of a television receiver set, so that a tuned status is retained even when a broadcast wave is interrupted for a short time.

14 Claims, 5 Drawing Figures

VOLTAGE MEMORY APPARATUS

BACKGROUND OF THE INVENTION

This invention relates to a voltage-memory apparatus useful in an automatic tuning apparatus provided with a variable-capacitance diode as a tuning element.

Hitherto, there has been known a conventional automatic-tuning apparatus, or voltage-memory apparatus, wherein a voltage applied to a variable-capacitance element such as a variable-capacitance diode is sweepingly changed, i.e., increased or decreased over a certain lapse of time, so that the tuned frequency received by the tuner, which includes the variable-capacitance diode, is varied gradually so as to sweepingly change the tuned frequency. Then, in such an apparatus, upon being tuned at the frequency of the signal to be received by the tuning apparatus, an intermediate frequency signal is produced in a tuner, and a control signal is generated by detecting the intermediate frequency signal, and the control signal stops the increase or decrease of the applied voltage, so that a specified voltage is held across the diode and the apparatus is kept in a tuned state. In such a conventional apparatus there has been the defect that once the received and tuned signal is interrupted, this tuning is broken and the apparatus again starts to sweep its tuning frequency, and hence, is no longer tuned to the received signal.

SUMMARY OF THE INVENTION

This invention provides a voltage-memory apparatus having a high capability for memorizing a voltage, and further provides an automatic tuning apparatus.

BRIEF DESCRIPTION OF THE DRAWING

The foregoing and other objects, features and advantages of this invention will be apparent from the following more detailed description of preferred embodiments of the invention as illustrated in the accompanying drawings, wherein.

DETAILED DESCRIPTION OF THE INVENTION

Figure 1:
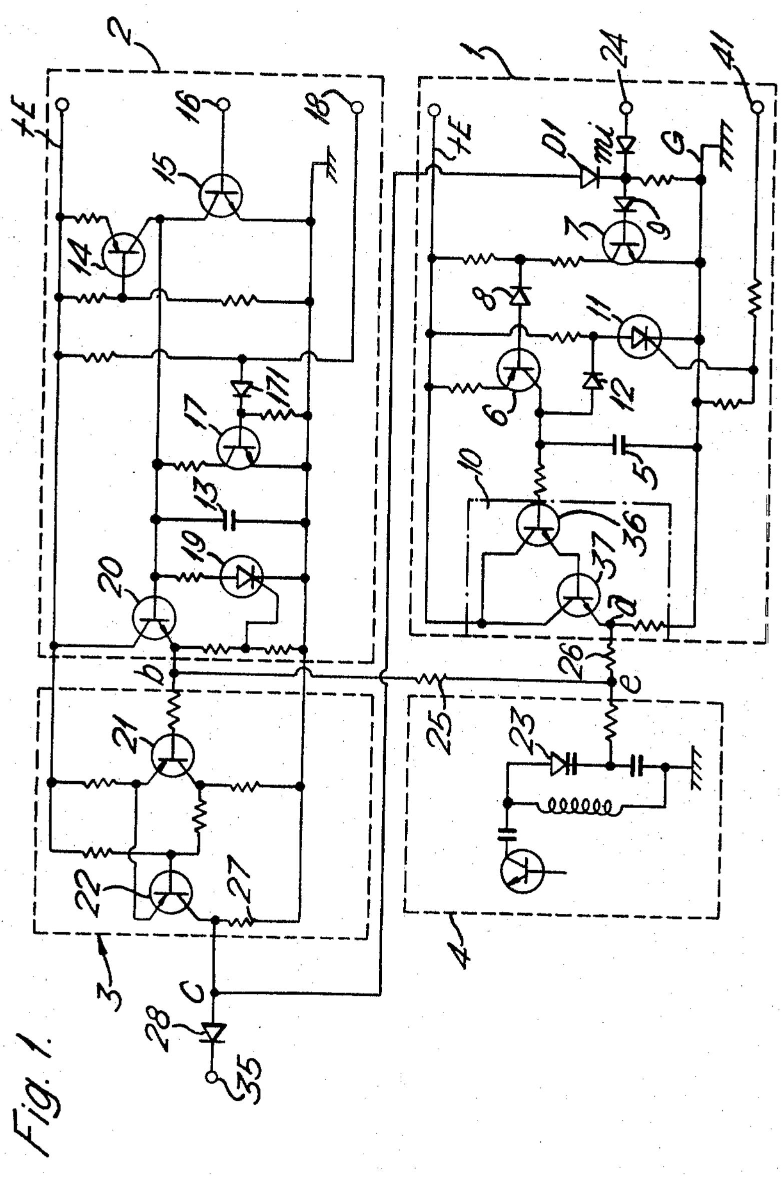
FIG. 1 is a circuit diagram of a voltage-memory apparatus embodying the present invention; curves *a* to *e*, as well as 24, 16, and 18 in FIG. 2 are wave forms for explaining operation of said embodiment.

In FIG. 1, an output terminal *a* of a main voltage-sweep circuit 1 is connected through a resistor 26 to a resonant circuit or a tuner 4 which contains a specified number of variable capacitance diodes as a tuning capacitance. Although a specified number of variable-capacitance diodes are contained in the tuner, these diodes are schematically represented by only one diode 23 in FIG. 1. Also, an output terminal *b* of an auxiliary voltage-sweep circuit 2 is connected to the tuner 4 through a resistor 25. An input terminal of a Schmitt trigger circuit 3 is connected to said output terminal *b* of the auxiliary voltage-sweep circuit 2. An output terminal *c* of the Schmitt circuit 3 is connected to an input terminal "mi" of the main voltage-sweep circuit 1. The input terminal "mi" is connected to the base of a transistor 7 through a level-shift diode 9.

In the main voltage-sweep circuit 1, the emitter-collector circuit of a transistor 6 and a capacitor 5 connected in series are connected across positive power line +E and ground line G, positive power line +E and ground line "G" being connected to positive and negative terminals of a power supply, not shown in FIG. 1. The base of the transistor 6 is connected to the collector of a switching transistor 7 through a level-shift diode 8. A thyristor 11 and a diode 12 in series-connection are connected across both ends of the capacitor 5, thyristor 11 being for controlling the discharge of the capacitor 5. When the thyristor is in the "off" condition the diode 12 prevents discharge current from leaking from the capacitor 5 by means of the large reverse resistance of the diode 12 and when the thyristor is in the "on" condition, the diode 12 allows the charge of the capacitor 5 to be discharged through the diode 12 and through the thyristor 11.

For the capacitor 5, a capacitor of a small leakage current such as a tantalum electrolytic capacitor (wet-type) is suitable. Voltage across the capacitor 5 is applied to the base of a transistor 36, which forms a Darlington circuit 10 with a transistor 37. The emitter of the transistor 37 is so connected as to apply the output voltage at the point *a* namely the above-mentioned emitter, through the resistor 26 to the variable capacitance-diode 23 of the tuner.

In the auxiliary voltage-sweep circuit 2, a charge-discharge capacitor 13 and the emitter-collector circuit of a transistor 14 for controlling charge-up current of the capacitor 13 are connected in series across the positive and negative power lines +E and G. The emitter and the collector of a transistor 15 for controlling charging of the capacitor 13 are connected to both ends of the capacitor 13, respectively. Also, the emitter and the collector of a transistor 17 are connected to both ends of the capacitor 13. The base of the transistor 17 is connected through a level shift diode 171 to a control terminal 18, to which a normally high control signal is applied. A thyristor 19 is connected across both ends of the capacitor 13 and its control electrode is connected to a voltage divider network connected to the output terminal *b* so as to discharge the capacitor 13 when voltage of the terminal *b* exceeds a preset value. A transistor 20 connected to constitute an emitter-follower produces an output signal to the output terminal *b,* which signal corresponds to the voltage across both ends of the capacitor 13. As has been set forth above, the output terminal *a* of the main voltage sweep circuit 1 and the output terminal *b* of the auxiliary voltage-sweep circuit 2 are connected to an input terminal *e* of the tuner 4 through the resistors 26 and 25 respectively. The resistance of the resistor 25 is selected to be far greater than that of 26. Also, the output terminal *b* is connected to the base of transistor 21 of the Schmitt circuit 3. The Schmitt circuit is so constituted that a first transistor 21 is normally in the "on" condition, and a second transistor 22 is normally in the "off" condition, and that these conditions are reversed when the output voltage of the auxiliary voltage-sweep circuit 2 reaches a certain value. Accordingly, the voltage at the output terminal *c* becomes "high" while the output of the auxiliary voltage-sweep circuit 2 is "high." The terminal $c$ is also connected through a diode 28 to a terminal 35, to which a normally high level is applied. The terminal 41 is for receiving a signal for triggering the thyristor 11 to reset the circuit 1 to a state so that the output voltage of the main voltage-sweep circuit 1 is at the lowest voltage which corresponds to the frequency of the lowest channel of the broadcast wave band.

OPERATION

Figure 2:
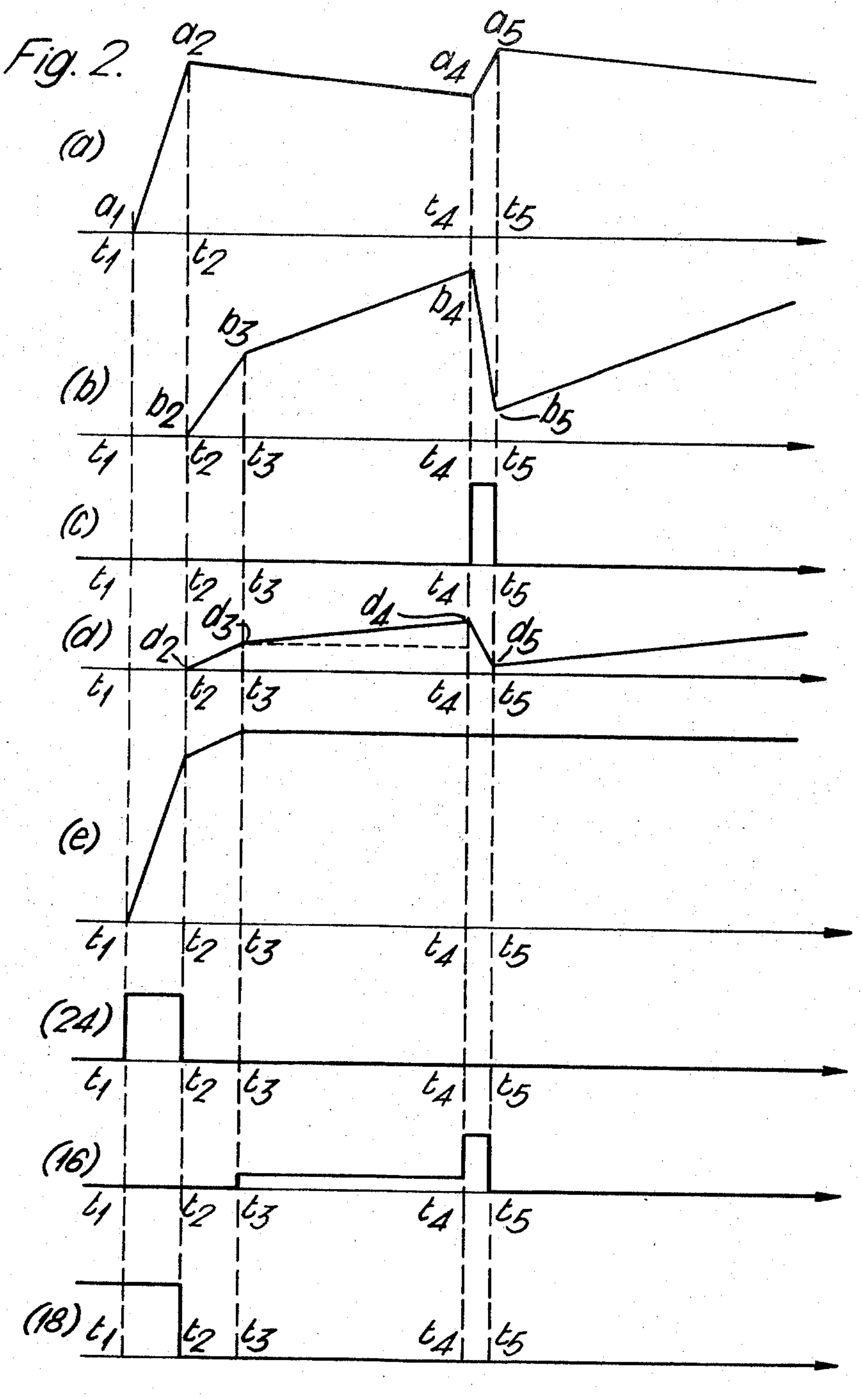
In FIGS. 2 and 5 the abscissae indicate time and the ordinates indicate voltage respectively.

The operation of the embodiment of FIG. 1 is explained in detail referring to FIG. 2. As has been stated above, a normally high level voltage is applied to terminals 18 and 35. A zero level voltage is applied to terminals 16 and 41.

When a positive input voltage is applied to an input terminal 24 of the main voltage-sweep circuit at a time $t_1$ as shown in FIG. 2 (24) and is retained thereafter, the transistor 7 is turned "on," thereby decreasing its collector potential almost to ground potential. Because of the "on" state of the transistor 7, the transistor 6 is turned "on" from its normally "off" stage, and the capacitor 5 starts charging. Accordingly, the voltage at the output terminal $a$ sweepingly rises as shown by segment $a_1$ to $a_2$ of FIG. 2 ($a$).

At a time $t_2$, when the frequency tuned by the tuner 4 approaches a broadcast frequency, the voltage which has been applied to the input terminal 24 is suddenly decreased to zero as shown in FIG. 2 (24), and transistors 7 and 6 are turned "off" and, therefore, the sweeping rise of the potential at the terminal $a$ stops at the point $a_2$ of FIG. 2 ($a$).

The decrease of the voltage at the terminal 24, as described above, at the time $t_2$, i.e., can be attained, for instance, with the following consideration. Namely, a third voltage-sweep circuit (not shown in the drawing) having a construction similar to that of the main voltage-sweep circuit 1 and an oscillator (not shown) having a variable-capacitance diode are provided. The main voltage-sweep circuit 1 and the third voltage-sweep circuit are controlled in such a manner that output voltage of either one of these circuits alternately increases while the output of the other circuit stops increasing its sweep. In each voltage-sweeping circuit each voltage difference from the start of a sweep to the end of the sweep corresponds to the frequency difference between the broadcast channels, and the sweeping rise of the output voltage of the main voltage-sweep circuit 1 starts from a voltage which corresponds to the frequency of the lowest channel of the broadcast-wave band.

In addition, the apparatus is constructed so that the third voltage-sweep circuit starts to sweepingly increase its output from a voltage corresponding to a preset frequency which is lower, by a frequency difference $f_2$, than the lowest channel frequency, and that when the frequency difference between the output of tuner 4 and the oscillator becomes $f_1 = f_2 + \Delta f$, the main circuit 1 ceases to sweep and the third circuit begins to sweep and, when the frequency difference again becomes $f_2$, the third circuit ceases and the main circuit 1 again starts to sweep, thus performing alternate sweeping.

Then, the beginning or end of the sweeping rise of the output of the main or third voltage-sweep circuit is counted, and when a desired figure corresponding to a desired channel is counted by a counter (not shown in the drawing) the output of the counter causes the signal applied to the terminals 18 and 24 to decrease to zero at the time $t_2$ and, hence, to turn the transistor 17 "off." On account of the cut-off of the transistor 17, the capacitor 13 in the auxiliary voltage-sweep circuit 2 starts charging as shown in FIG. 2 ($b$), and the output voltage of the circuit 2 increases from the time $t_2$ as shown by the segment $b_2$–$b_3$ in FIG. 2 ($b$).

The output voltage of the main voltage-sweep circuit 1 and that of the auxiliary voltage-sweep circuit 2 are applied to the variable capacitance-diode 23 through the input terminal $e$ of the tuner 4, being added together through the resistors 26 and 25, respectively. The resultant voltage at the terminal $e$ is shown by the curve in FIG. 2 ($e$).

When, at time $t_3$, the voltage of the terminal $e$ reaches a level corresponding to a certain tuned frequency of the tuner 4, by detecting a tuned output of an intermediate-frequency amplifier at this time $t_3$, a control signal begins being produced in a frequency discriminator (not shown) and is applied to the terminal 16 as shown in FIG. 2 (16). This causes the voltage at the terminal $b$ to gradually increase as shown by a segments $b_3$–$b_4$ in FIG. 2 ($b$). Then, at the time $t_4$ of the Schmitt circuit 3 is inverted and its output is supplied to the main voltage-sweep circuit 1, accordingly increasing the output voltage of the main voltage-sweep circuit 1. However, by means of a negative feedback loop consisting of the tuner 4, the intermediate-frequency amplifier (not shown) the discriminator (not shown) and the auxiliary voltage-sweep circuit 2, the output voltage of the auxiliary voltage-sweep circuit 2 is lowered as shown by the segment $b_4$–$b_5$ so that resultant voltage at the terminal $e$ becomes constant. The resultant voltage consists of the voltage at the terminal $a$ and a divided voltage formed by dividing the output of the terminal $b$ by a dividing-network consisting of the resistors 25 and 26. The waveform of the divided voltage is shown in FIG. 2 ($d$). Accordingly, thereafter the output voltage at the terminal $b$ which is indicated by the segments $b_4$–$b_5$ of FIG. 2 ($b$) decreases.

On the other hand, although the capacitor 5 is selected to hold the charged voltage stably for a long time, on account of unavoidable leakage in the capacitor 5, the output voltage at the terminal $e$ of the main voltage-sweep circuit 1 decreases slightly after $t_2$ as shown by a segments $a_2$–$a_4$ of FIG. 2 ($a$). However, this decrease is compensated by the increase of the output voltage of the auxiliary voltage-sweep circuit 2. Accordingly, the resultant compensated voltage at the terminal $e$ becomes constant after the time $t_3$ as shown in FIG. 2 ($e$). After a long lapse of time, namely at a time $t_4$, when the voltage at the terminal $d$ reaches a preset level, the output of the Schmitt circuit 3 is inverted, causing the Schmitt circuit 3 to supply a positive output signal at its output terminal $c$ as shown in FIG. 2 ($c$). The output at the terminal $c$ is supplied to the base of the transistor 7.

By receiving a positive input voltage from the terminal $c$ the transistors 7 and 6 are turned "on," and, accordingly, the capacitor 5 is charged again, causing the voltage at the output terminal $a$ to increase from $t_4$ as shown by a segment $a_4$–$a_5$ of FIG. 2 ($a$)

Due to the increase of voltage at the terminal $a$, at the time $t_4$ the voltage applied to the variable capacitance diode 23 begins to increase. This latter increase causes the tuner 4 to increase the tuned frequency and, accordingly, the output of the discriminator increases. This increase causes a higher increase in the control signal at the terminal 16 as shown in FIG. 2 (16). Since the signal at the input terminal 16 increases during the period of $t_4$ to $t_5$, the current flowing through the transistor 15 increases, and discharges the capacitor 13. Thus, the output voltage at the terminal *b* suddenly decreases until a time $t_5$ as shown by segment $b_4$–$b_5$ in FIG. 2 (*b*). From the time $t_5$ on, a slight leakage of charge in the capacitor 5 and a resulting slight decrease of the voltage at the terminal *a*, as well as compensating increase of the voltage at the terminal *b* are repeated in the same way as above.

As is explained in the above, the resultant added voltage at the terminal *e* becomes constant upon and after the tuner's tuning in a broadcast signal, that is to say, the voltage corresponding to the tuned frequency is memorized.

IN CASE OF INTERRUPTION OF BROADCAST WAVE

In case the broadcast signal is interrupted after memorization of the voltage, auxiliary voltage-sweep circuit 2 starts to sweep the charging the capacitor 13, i.e., gradually increasing its output voltage, and inverts the state of the Schmitt circuit 3. However by connecting terminal 35 to ground directly or through a small impedance and hence, keeping the terminal 35 at substantially zero volts during the interruption of the broadcast signal, the output of the Schmitt circuit 3 does not influence the operation of the main voltage-sweep circuit 1.

When the broadcast signal is received again, the signal from the discriminator at the terminal 16 is restored, the charging of the capacitor 13 is stopped, and the main voltage-sweep circuit 1 starts to sweep again.

Thus, as explained above, the voltage applied to the variable capacitor 23 is retained, i.e., memorized.

In a practical embodiment, the voltage produced by detecting a picture-intermediate-frequency signal or by detecting a synchronizing signal, namely detecting the broadcast signal, is impressed on the terminal 35. By means of such a connection, the diode 28 is cut-off during the existence of broadcast signal due to the positive voltage at the terminal 35, and is conductive and grounds the voltage at the terminal *c* during the absence of the broadcast signal. Further, in place of the Schmitt circuit 3, any conventional voltage detection circuit can be utilized.

Figure 3:
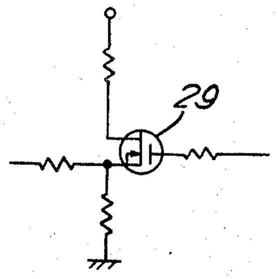
FIG. 3 indicates a circuit which can be substituted for a part of the voltage-memory apparatus shown in FIG. 1.

Also, instead of the Darlington circuit 10 comprising the transistors 36 and 37, a circuit as shown in FIG. 3 comprising a metal-oxide-silicon type (MOS) transistor 29 can be utilized so as to take advantage of its large input-resistance.

Figure 4:
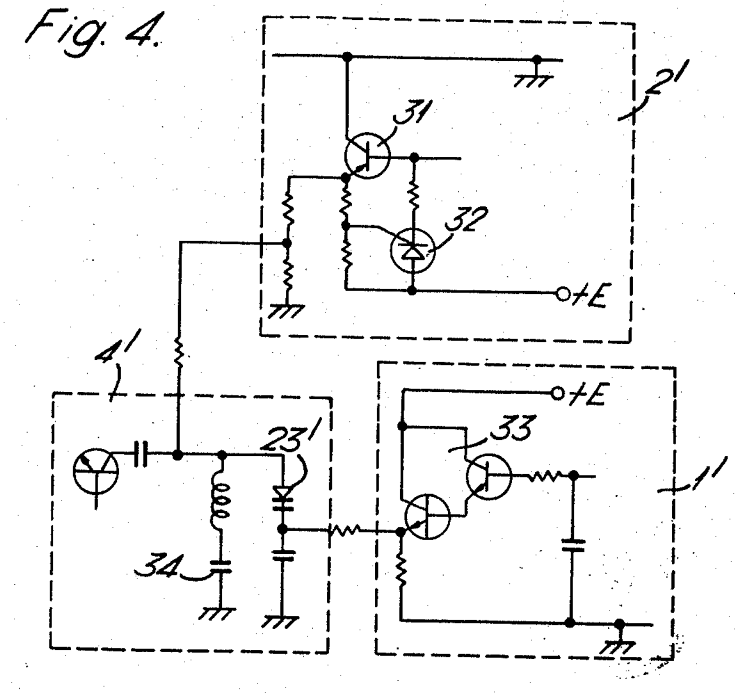
FIG. 4 indicates a circuit which can be substituted for another part of the apparatus of FIG. 1; and curves *a* to *e*, as well as 24, 16, and 18 in FIG. 5 are wave forms for explaining another way of operation of the embodiment shown in FIG. 1.

FIG. 4 illustrates a modified circuit portion to be used in place of part of the apparatus of FIG. 1. In FIG. 4, the output voltage of an auxiliary voltage-sweep circuit 2′ is applied to the anode of a variable-capacitance diode 23′, and the output voltage of a main voltage-sweep circuit 1′ is applied to the cathode of the diode 23′. In this circuit of FIG. 4, the polarity of the output voltage of the auxiliary voltage-sweep circuit 2′ is inverted to be opposite to that of the circuit 2 of FIG. 1. In FIG. 4, elements 1′, 33, 2′, 31, 32, 4′ and 23′ correspond to elements 1, 10, 2, 20, 19, 4 and 23 of FIG. 1, respectively. A capacitor 34 is for blocking D.C. voltage and grounding high-frequency signals. As a result of the connection as shown in FIG. 4, wherein the output of the main voltage-sweep circuit 1′ and that of auxiliary voltage-sweep circuit 2′ are applied to separate points, clamping the output voltage of the main voltage-sweep circuit at its lowest level can be easily attained without difficulty for instance, by connecting the cathode of the variable capacitance diode 34′ to a conventional clamping circuit.

Figure 5:
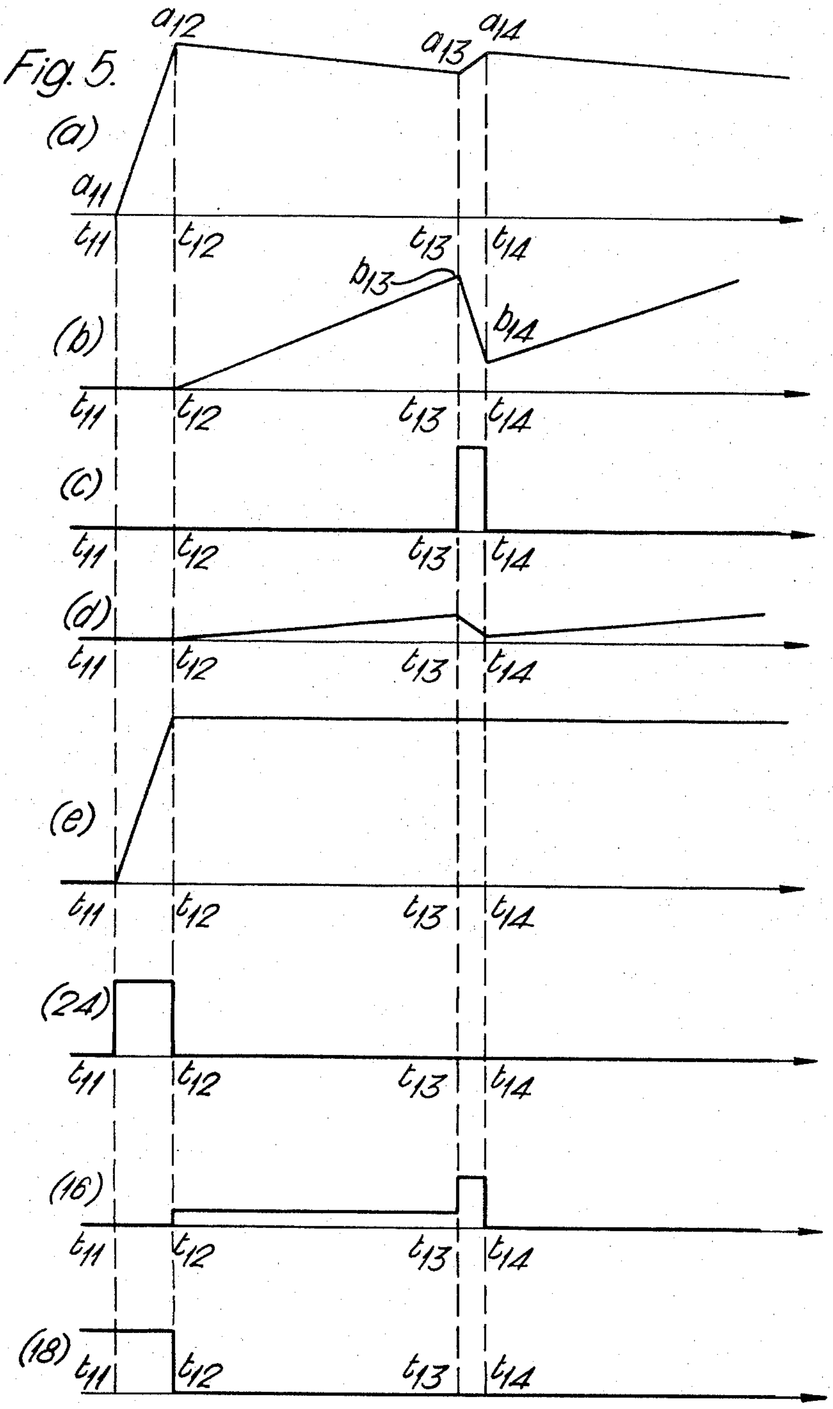

FIGS. 5 (*a*) to 5 (*e*) as well as (24), (16) and (18) show another example of operation of the apparatus of FIG. 1. In this operation, as shown at (24), a positive voltage is applied to the input terminal 24, at starting time $t_{11}$, and turns the transistors 7 and 6 "on." As a result of turning transistor 6 "on" the capacitor 5 begins charging and the output at the terminal *a* starts increasing as shown by a segment $a_{11}$–$a_{12}$. When the tuner is tuned to a frequency of a broadcast signal at a time $t_{12}$, the output of the intermediate-frequency amplifier is detected by the discriminator and causes the positive voltage at the terminal 24 to decrease at the time $t_{12}$. This decrease causes the sweeping-rise of the output voltage at the terminal *a* to stop at the time $t_{12}$. Accordingly, after the time $t_2$, the output at the terminal *a* begins to decrease slowly on account of leakage in the capacitor 5. In this example, the signal at the terminal 18 is programmed to decrease at the time $t_{12}$ when the tuning frequency reaches a broadcast frequency. As a result of this decrease, the capacitor 13 begins charging and, accordingly, the voltage at the output terminal *b* of the auxiliary voltage-sweep circuit 2 begins to increase.

When, at a time $t_{12}$, the voltage at the terminal *e* reaches a level corresponding to a certain tuned frequency of the tuner 4, by detecting the tuned output of an intermediate-frequency amplifier at time $t_{12}$, a control signal is produced by a frequency discriminator (not shown) and is applied to the terminal 16, as shown in FIG. 2 (16).

Outputs from the terminals *a* and *b* are added at the terminal *e* and provide a constant voltage as shown by FIG. 5 (*e*). FIG. 5 (*b*) shows the voltage at the terminal *b* which is proportional to the voltage across the voltage across the capacitor 13.

The output of the Schmitt circuit 3 is inverted at a time $t_{13}$ when the output voltage at the terminal *b* reaches a preset level, and a positive output signal shown in FIG. 5 (*c*) is applied from the output terminal *c* of the Schmitt circuit to an input terminal "mi" of the circuit 1. This positive signal causes the main voltage-sweep circuit 1 to sweepingly increase its output voltage and the auxiliary voltage-sweep circuit 2 to stop the sweeping-increase, during its duration from the time $t_{13}$ to time $t_{14}$. Like the former operation, an alternate increase of output voltage of either the main or auxiliary voltage-sweep circuit is repeated maintaining a resultant constant voltage at the terminal *e*.

The invention being thus described, it will be obvious that the same may be varied in many ways. Such variations are not to be regarded as a departure from the spirit and scope of the invention, and all such modifications are intended to be included with the scope of the following claims.

I claim:

1. An apparatus comprising:

first means, responsive to a first input signal, for producing a first output voltage which increases with respect to time during the application of said first input signal and which remains substantially at the same level existing at the moment when said first input signal is removed;

second means, responsive to a second input signal, for producing a second output voltage which increases with respect to time from the moment of cessation of the increase of said first output voltage and being of such a value so as to compensate for any deviation of said first output voltage from said level; and third means, responsive to the outputs of said first and second means, for combining the outputs of said first and second means.

2. An apparatus according to claim 1, further comprising:

a resonant circuit containing a variable-capacitance diode as its resonant element;

fourth means for applying the output of said third means to said variable-capacitance diode; and fifth means, responsive to the difference in the frequency of said resonant circuit and a standard frequency, for supplying a control signal representative of said difference to said second means for controlling the increase in the level of said second output voltage, whereby the resultant voltage applied to said variable capacitance diode is constant.

3. An apparatus according to claim 2, wherein said third means includes a summing junction, receiving the outputs of said first and second means, which is connected to one end of said variable-capacitance diode.

4. An apparatus according to claim 2, wherein the output of one of said first and second means is applied to one end of said variable-capacitance diode and further comprising sixth means, responsive to the output of the other of said first and second means, for inverting the polarity of said other output and applying said inverted polarity to the other end of said variable-capacitance diode.

5. An apparatus according to claim 2, wherein said fifth means comprises:

means, responsive to the level of said first output voltage reaching a prescribed level close to but apart, by a specified voltage difference, from a desired voltage to be attained, for stopping the increase of said first output voltage, means, responsive to the sum of said first and second output voltages, for effecting an increase of the level of said second output voltage, until said sum reaches a predetermined level, and for controlling the increase of said second output voltage subsequent thereto for compensating for a slight decrease in said summed voltages resulting from a decrease in said first output voltage.

6. An apparatus according to claim 5, further comprising detection means, responsive to said second output voltage reaching a preset level, for initiating an increase in said first output voltage by said first means, and inhibition means, responsive to the mis-tuning of said resonant circuit to an incorrect frequency, for preventing the application of said control signal to second means.

7. An apparatus according to claim 6, wherein said detection means comprises a Schmitt trigger circuit connected at its input to the output of said second means, and its output to the input of said first means.

8. An apparatus according to claim 1 wherein said first means comprises:

a Darlington connection circuit for supplying said first output voltage, said Darlington connection circuit including first and second transistors connected together;

a memory capacitor connected between the base of said first transistor and a source of reference potential, said first output voltage being provided at the emitter of said second transistor.

9. An apparatus according to claim 1, wherein said first means comprises a metal-oxide-silicon transistor, at one electrode of which said first output voltage is supplied, and a voltage memory capacitor connected between the control gate of said transistor and a source of reference potential.

10. An apparatus according to claim 1 wherein said third means comprises a summing network, connected to the output of said first and second means, for summing said first and second output voltages.

11. An apparatus according to claim 10, further including a resonant circuit, including a variable-capacitance diode, connected to the output of said summing network.

12. An apparatus according to claim 11, further including a Schmitt trigger circuit connected between the output of said second means and the input of said first means.

13. An apparatus according to claim 12, wherein at least one of said first and second means comprises a storage capacitor and a transistor circuit coupled to said capacitor for controlling the charging and discharge thereof in response to a respective one of said inputs.

14. An apparatus according to claim 13, wherein each of said first and second means comprises a storage capacitor and a transistor circuit coupled thereto for supplying said first and second respective output voltages.

* * * * *